United States Patent
Ramkumar et al.

(10) Patent No.: US 6,803,330 B2
(45) Date of Patent: Oct. 12, 2004

(54) METHOD FOR GROWING ULTRA THIN NITRIDED OXIDE

(75) Inventors: Krishnaswamy Ramkumar, San Jose, CA (US); Sundar Narayanan, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/975,256

(22) Filed: Oct. 12, 2001

(65) Prior Publication Data

US 2003/0073290 A1 Apr. 17, 2003

(51) Int. Cl.⁷ ............................................... H01L 21/31

(52) U.S. Cl. ...................... 438/783; 438/765; 438/769; 438/775; 438/786; 438/787

(58) Field of Search ................................. 438/769, 770, 438/775, 787, 981, 254, 253, 763, 964

(56) References Cited

U.S. PATENT DOCUMENTS

| | | | |
|---|---|---|---|
| 5,403,786 A | | 4/1995 | Hori |
| 5,464,792 A | * | 11/1995 | Tseng et al. ................ 438/585 |
| 5,521,127 A | | 5/1996 | Hori |
| 5,629,221 A | | 5/1997 | Chao et al. |
| 5,766,994 A | * | 6/1998 | Tseng ......................... 438/254 |
| 5,880,040 A | | 3/1999 | Sun et al. |
| 6,180,543 B1 | * | 1/2001 | Yu et al. ..................... 438/787 |
| 6,245,616 B1 | * | 6/2001 | Buchanan et al. .......... 438/287 |
| 6,294,819 B1 | * | 9/2001 | Sun ............................. 257/410 |
| 6,323,094 B1 | * | 11/2001 | Wu ............................. 438/303 |
| 6,399,520 B1 | * | 6/2002 | Kawakami et al. ......... 438/778 |
| 6,436,818 B1 | * | 8/2002 | Hu et al. .................... 438/656 |
| 6,479,349 B1 | * | 11/2002 | Oya et al. ................... 438/261 |
| 2002/0017677 A1 | * | 2/2002 | Kai et al. ................... 257/314 |
| 2002/0039844 A1 | * | 4/2002 | Lee ............................. 438/778 |

OTHER PUBLICATIONS

Peter van Zant; Microchip Fabrication, 2000; McGraw–Hill; Fourth Edition; pp. 156, 160, 188–189, 503 and 513–514.*
Wolf et al., Silicon Processing for the VLSI Era (2000), Lattice Press, Second Edition, vol. 1, p. 198.*
Van Zant, Peter; Microchip Fabrication A practical guide to semiconductor processing (2000); McGraw–Hill; Fourth Edition; pp. 172–173.*
Gusev, et al., "Growth and Characterization of Ultrathin Nitrided Silicon Oxide Films", IBM J. Res. Develop,, 43, 3, 265–286 (1999).
Hook, et al., "Nitrided Gate Oxides for 3.3–V Logic Application: Reliability and Device Design Considerations", IBM J. Res. Develop., 43, 3, 393–406 (1999).
Buchanan, "Scaling the Gate Dielectric: Materials Integration, and Reliability", IBM J. Res. Develop., 43, 3, 245–264 (1999).
Evans, et al., "High Performance CMOS Devices with 20 Å Engineered Oxynitrided Gate Dielectrics", paper presented at Semicon Korea Technical Symposium (2000).

* cited by examiner

Primary Examiner—Carl Whitehead, Jr.
Assistant Examiner—David L. Hogans
(74) Attorney, Agent, or Firm—Piper Rudnick LLP; Steven B. Kelber

(57) ABSTRACT

A method of nitriding a gate oxide layer by annealing a preformed oxide layer with nitric oxide (NO) gas is disclosed. The nitridation process can be carried out at lower temperatures and pressures than a conventional nitrous oxide anneal while still achieving acceptable levels of nitridation. The nitridation process can be conducted at atmospheric or sub-atmospheric pressures. As a result, the nitridation process can be used to form nitrided gate oxide layers in-situ in a CVD furnace. The nitrided gate oxide layer can optionally be reoxidized in a second oxidation step after the nitridation step. A gate electrode layer (e.g., boron doped polysilicon) can then be deposited on top of the nitrided gate oxide layer or on top of the reoxidized and nitrided gate oxide layer.

20 Claims, 1 Drawing Sheet

METHOD FOR GROWING ULTRA THIN NITRIDED OXIDE

BACKGROUND OF THE INVENTION

1. Field of the Invention

This invention relates, in general, to a process for fabricating integrated circuit devices in which a layer of an oxynitride material is formed and, in particular, to a method of nitriding a gate oxide layer using nitric oxide (NO) gas.

2. Background of the Technology

Semiconductor devices such as MOS (metal-oxide-semiconductor) devices are typically formed on a substrate such as a silicon wafer. Typically, one or more films of an insulating material such as silicon dioxide are formed on the substrate over which is formed a gate electrode. The insulating film formed between the gate electrode and the silicon substrate is referred to as the gate oxide or gate dielectric. A widely employed type of MOS integrated circuit is a metal-oxide-semiconductor field-effect transistor, or MOSFET.

Boron doping of the gate electrodes of MOS devices (e.g., $p^+$ gates) has been used to improve device performance by reducing short-channel effects and lowering threshold voltages. Typically, boron is implanted into the poly-Si gate at sufficiently high concentrations to ensure adequate conductance of the poly-Si gate. With the continued push for smaller and smaller MOSFET dimensions, however, higher active dopant concentrations are required. When boron is used as the dopant for $p^+$ gates, boron atoms in the gate layer can diffuse into the gate dielectric during downstream processing. Boron, which is a relatively small atom, has a very high diffusion coefficient in both silicon and silicon dioxide at temperatures encountered during processing. Further, it is necessary to activate the boron dopant after implantation with a high-temperature anneal which is typically conducted at temperatures in the range of 950–1050° C. During this high-temperature anneal, boron diffusion can be exacerbated.

Boron penetration into and through the gate dielectric can also have significant effects on device characteristics. First, boron penetration through the gate dielectric and into the channel can influence device performance. Boron diffusion into the channel, for example, can result in a shift in the threshold voltage of the device and can even result in charge-induced damage and breakdown during device operation. Also, as boron penetrates into the gate dielectric layer, the capacitance-voltage (C–V) or flat-band voltage of the device can shift which can degrade device performance. The presence of boron in the gate oxide film can also degrade the quality of the gate oxide film.

The reduction of boron penetration is particularly important in light of the decreasing dielectric layer thicknesses of modem MOS devices. It is known to incorporate nitrogen into an oxide film to retard the effects of boron penetration. Nitrogen is believed to block boron diffusion by forming B-N complexes.

The amount of nitrogen incorporated into the gate oxide generally determines the effectiveness of the oxide layer in blocking boron diffusion. The amount of nitrogen doping required in a particular application, however, is dictated in part by the thermal cycles to which the device is subjected after deposition and doping of the gate electrode. Typical amounts of nitrogen required for adequate levels of boron diffusion blocking are in the range of 1 to 3 at %.

Nitrogen has been incorporated into $SiO_2$ using various methods. These methods include thermal oxidation followed by annealing in a nitrogen containing environment (thermal nitridation) and various deposition techniques such as physical vapor deposition (PVD) and chemical vapor deposition (CVD).

Various nitrogen containing gases have been employed for thermal nitridation and oxy-nitride deposition, including $N_2$, $NH_3$, NO and $N_2O$. See, for example, U.S. Pat. Nos. 5,403,786; 5,521,127; 5,629,221; and 5,880,040. See also Gusev, et al., "Growth and Characterization of Ultrathin Nitrided Silicon Oxide Films", in IBM J. Res. Develop., Vol. 43, No. 3, May 1999, pp. 265–286; Hook, et al., "Nitrided Gate Oxides for 3.3-V Logic Application: Reliability and Device Design Considerations", in IBM J. Res. Develop., Vol. 43, No. 3, May 1999, pp. 393–406; and Buchanan, "Scaling the Gate Dielectric: Materials, Integration and Reliability", in IBM J. Res. Develop., Vol. 43, No. 3, May 1999, pp. 245–264. Evans, et al. disclose a high pressure (15 to 25 atm.) process for oxynitride gate formation using nitric oxide gas. gas. See Evans, et al., "High Performance CMOS Devices with 20 Å Engineered Oxynitride Gate Dielectrics", Paper Presented at Semicon Korea Technical Symposium, February 2000).

Conventional nitridation methods, however, generally result in a relatively low concentration of nitrogen in the films. For example, oxide films that were either grown or annealed in $N_2O$ typically have total integrated nitrogen concentrations of less than 1 at. %. While these relatively low concentrations of nitrogen may be sufficient for controlling channel hot-electron degradation effects in MOSFETs, they are usually insufficient to reduce the effects of boron penetration from a $p^+$ poly-Si gate into and through the gate dielectric layer. In order to incorporate sufficient amounts of nitrogen in the gate oxide layer, annealing has typically been conducted at relatively high temperatures (e.g., 900° C. and greater) and/or relatively high pressures well in excess of atmospheric pressure.

The use of a CVD furnace has been found to produce relatively thin oxide layers having high uniformity due in part to the low oxidation rates that can be achieved in a CVD furnace. CVD furnaces, however, are designed to operate at atmospheric or sub-atmospheric pressures and are typically not designed to exceed about 800° C. The extreme annealing temperatures and pressures required to achieve adequate gate nitridation with conventional nitridation processes thus preclude the use of a CVD furnace to perform nitridation using a nitrous oxide anneal. Also, CVD races can not be easily adapted for use with torches conventionally used for preheating nitridation gases such as $N_2O$.

There still exists a need for a nitridation process which incorporates a sufficient amount of nitrogen into the gate oxide layer at relatively low pressures and temperatures such that annealing can be conducted in a CVD furnace. Such a process would allow for in-situ nitridation in a CVD furnace after gate oxide formation.

SUMMARY OF THE INVENTION

According to a first aspect of the invention, a method of forming a gate oxide layer on a semiconductor substrate is provided. The method comprises: forming an oxide layer on the substrate by oxidizing the substrate in a CVD furnace; introducing nitric oxide (NO) gas into the CVD furnace; and nitriding the oxide layer with the nitric oxide gas in-situ . In a preferred embodiment of the aforementioned method, the oxide forming and nitriding steps are performed at approximately the same temperature. According to another preferred embodiment of the aforementioned method, the oxide forming and/or nitridation steps are performed at a pressure of about 1 atm. or less. The nitrided gate oxide layer can optionally be reoxidized in a second oxidation step after the nitridation step. A gate electrode layer can be then deposited on top of the nitrided gate oxide layer or on top of the reoxidized and nitrided gate oxide layer. In a preferred embodiment the gate electrode layer comprises a polysilicon layer or a polycrystalline silicon/germanium layer which is doped with a dopant such as boron. The gate electrode layer according to the invention can also be a stack comprising a polysilicon layer or a polycrystalline silicon/germanium layer in combination with a separate layer of material such as tungsten or tungsten silicide.

According to a second aspect of the invention, a method of nitriding a gate oxide layer on a semiconductor substrate with nitric oxide (NO) gas is provided. The nitriding step is conducted at a temperature of about 800° C. or less and at a pressure of about 1 atm or less.

BRIEF DESCRIPTION OF THE FIGURES

The invention will be described with reference to the accompanying figure, wherein.

DETAILED DESCRIPTION OF THE INVENTION

Figure 1:
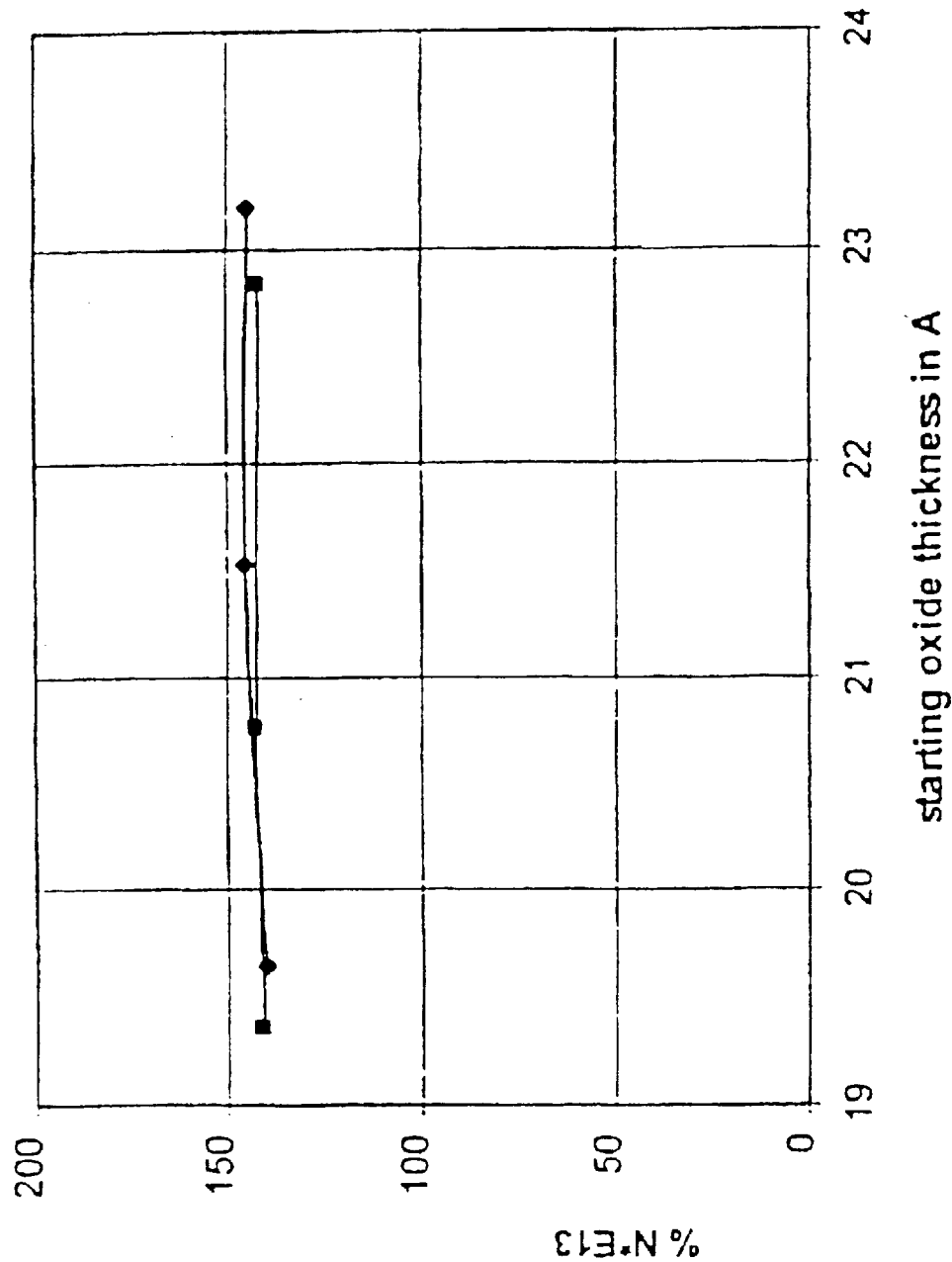
FIG. 1 is a graph showing the effect of using a torch furnace to preheat the nitric oxide (NO) gas on the amount of nitrogen incorporated into the oxide layer as a function of starting oxide thickness.

A conventional method for incorporating nitrogen into a gate oxide layer comprises annealing a preformed oxide layer in the presence of nitrous oxide gas ($N_2O$). Annealing with $N_2O$, however, is generally not effective in incorporating more than 1 to 1.5 wt. % of N in the gate oxide layer. Additionally, in order to achieve significant nitrogen incorporation using $N_2O$ gas, it has been found necessary to pre-heat the gas before it enters the furnace. Preheating is usually conducted by flowing the $N_2O$ gas through a torch that is maintained at a temperature of from 800° C. to 950° C. A helical torch is typically employed to increase the residence time of the gas in the torch. The $N_2O$ nitridation anneal itself is typically conducted at temperatures in excess of 900° C.

The high annealing temperatures required for $N_2O$ annealing (e.g., 900° C. to 1000° C. and greater) may cause undesired diffusion of channel dopants. Further, conventional CVD furnaces are not designed to be used at temperatures in excess of 800–825° C. As a result, for gate oxide layers grown in a CVD furnace, the wafer must be transported to a separate furnace after oxidation where nitridation at high temperatures can be conducted. For at least these reasons, $N_2O$ nitridation has not been successfully adapted for use in CVD furnaces.

Another disadvantage of annealing the gate oxide layer in nitrous oxide is that significant oxidation may occur during the anneal process. The oxide formed during the nitrous oxide anneal can have poor uniformity and can thus degrade the overall uniformity of the gate oxide layer.

The nitridation process according to the invention comprises annealing a preformed oxide layer using nitric oxide (NO) gas. The process according to the invention offers advantages over a conventional nitrous oxide anneal. These advantages include the ability to achieve a higher nitrogen incorporation at low (e.g., 800° C. or less) temperatures as well as the ability to achieve adequate levels of nitrogen incorporation at low pressures, up to and including sub-atmospheric pressures. As a result, the nitridation process according to the invention can be conducted in a CVD furnace. In a preferred embodiment of the invention, nitridation is conducted in-situ in a CVD furnace after oxide formation.

Since the nitridation can be carried out at lower temperatures, the process according to the invention allows for the oxidation and the nitridation steps to be carried out at approximately the same temperature. According to a preferred embodiment of the invention, nitridation and oxidation are conducted within a temperature of +/−5° C., more preferably within a temperature of +/−1° C. In this manner, time consuming temperature ramps between successive steps in the process can be reduced or even eliminated. As a result, cycle times and, consequently, process costs can be reduced.

Further, the nitridation process according to the invention can also be conducted at sub atmospheric pressures. As a result, oxidation and nitridation can be conducted at low pressures in a CVD furnace. The use of sub atmospheric pressures during thermal oxide formation can lower the oxidation rate and thus provide better thickness control for thin (e.g., 8 to 15 Å thick) oxide layers. Since a significant amount of nitrogen can be incorporated at sub atmospheric pressures, the process according to the invention can be used to improve the quality of deposited oxides. Oxide quality is particularly important when reoxidizing nitrided gate oxide layers to form an ONO (oxide-nitride-oxide) stack. The quality of the top oxide layer in the ONO stack can be significantly affected by initial oxide uniformity.

As set forth above, the nitridation process according to the invention does not require preheating of the nitrogen containing gas. This effect is demonstrated in FIG. 1 which is a graph showing the effect of using a torch furnace to preheat the NO gas on the amount of nitrogen incorporated into the oxide layer. The % nitrogen content of the oxide layer is plotted as a function of starting oxide thickness. Nitrogen content was determined from the change in oxide thickness upon reoxidation. This procedure is described in copending application Ser. No. 09/975,257, filed on even date herewith, which application is hereby incorporated by reference in its entirety.

In FIG. 1, the data points represented by the symbol (♦) show %N content as a function of starting oxide thickness when no torch is used to preheat the NO gas. The data points represented by the symbol (■) show %N content as a function of starting oxide thickness when a torch is used to preheat the NO gas. As can be seen from FIG. 1, the amount of nitrogen incorporated into the oxide layer is not significantly affected by using a torch to preheat the NO gas. Thus, a torch preheating step, which is typically used for nitridation anneals with nitrous oxide gas, can be eliminated when using nitric oxide gas according to the invention.

Since CVD furnaces are typically not equipped with torches for preheating nitridation gases, nitridation according to the invention can be done in a conventional CVD furnace without costly modifications.

The initial oxide layer can be formed by any known oxide forming process. In a preferred embodiment of the invention, the initial oxide layer is a thermal oxide layer formed by reacting the substrate with an oxygen containing gas. According to a preferred embodiment of the invention, the substrate comprises silicon and the oxide layer comprises silicon dioxide ($SiO_2$). The thickness of the initial oxide layer can be chosen based on the requirements of the device being fabricated. The initial oxide layer according to the invention preferably has a thickness of less than 15 Angstroms. For example, the initial oxide layer can have a thickness of 8 to 15 Angstroms.

The nitridation process according to the invention can be conducted at pressures of 1.5 atm. or less. In a preferred embodiment of the invention, nitridation is conducted at pressures of about 1 atm. or less. The nitridation step can be conducted at any temperature up to the capabilities of the CVD furnace. According to a preferred embodiment of the invention, nitridation is conducted at a temperature of about 800° C. or less. The amount of nitrogen incorporated into the oxide layer can be varied based on the requirements of the device being fabricated. According to a preferred embodiment of the invention, the amount of nitrogen incorporated into the oxide layer is at least 1.5 at.%.

Initial oxide formation and nitridation can be conducted in the same chamber or in separate chambers. For example, initial oxide formation can be conducted by any known technique in a first chamber. The oxidized substrate can then be transferred to a CVD chamber and nitrided according to the invention. According to a preferred embodiment of the invention, oxidation and nitridation are conducted in the same CVD chamber.

The nitrided gate oxide layer according to the invention can be subject to a reoxidation process. Also, a gate electrode layer can be deposited over the nitrided gate oxide layer or the reoxidized nitrided gate oxide layer according to the invention. The gate electrode layer can be any material used in the art. For example, the gate electrode material can be a polysilicon or a polycrystalline silicon germanium layer. The gate electrode may be a stack comprising a polysilicon or a polycrystalline silicon germanium layer and one or more additional layers. Suitable additional layers include tungsten and tungsten silicide. The gate electrode may also be doped with a dopant. Any art recognized dopant for gate electrodes (e.g., boron) can be employed according to the invention.

These and other modifications and variations to the present invention may be practiced by those of ordinary skill in the art, without departing from the spirit and scope of the present invention Furthermore, those of ordinary skill in the art will appreciate that the foregoing description is by way of example only, and is not intended to limit the invention.

What is claimed is:

1. A method of forming a gate oxide layer on a semiconductor substrate comprising:

forming an oxide layer on the substrate by thermally oxidizing the substrate in a chemical vapor deposition furnace at a pressure of about 1.5 atm or less and at a temperature of 800° C. or less;

introducing nitric oxide (NO) gas into the chemical vapor deposition furnace; and nitriding the oxide layer in the presence of the nitric oxide gas at a pressure of 1.5 atm or less and at a temperature of 800° C. or less, wherein the oxide layer on the substrate is grown through thermal oxide formation.

2. The method of claim 1, wherein the oxide forming and nitriding steps are performed at approximately the same temperature.

3. The method of claim 1, wherein the nitriding step is performed at a pressure of about 1.0 atm. or less.

4. The method of claim 1, further comprising a step of reoxidizing the semiconductor substrate in a second oxidation step after the nitriding step.

5. The method of claim 1, further comprising a step of depositing a gate electrode layer on top of the nitrided oxide layer.

6. The method of claim 5, wherein the gate electrode layer comprises a polysilicon layer or a polycrystalline silicon/germanium layer.

7. The method of claim 6, wherein the gate electrode layer further comprises a tungsten layer or a tungsten silicide layer.

8. The method of claim 5, comprising a step of doping the gate electrode layer with dopant.

9. The method of claim 8, wherein the dopant is boron.

10. The method of claim 1, wherein the substrate comprises Si and wherein the step of forming the oxide layer comprises forming an $SiO_2$ layer.

11. The method of claim 1, wherein the step of forming the oxide layer comprises reacting the substrate with an oxygen containing gas.

12. The method of claim 1, wherein the step of forming the oxide layer comprises forming an oxide layer having a thickness of about 15 Å or less.

13. The method of claim 1, wherein at least 1.5 wt. % of N is incorporated into the oxide layer during the nitriding step.

14. The method of claim 1, wherein the oxide layer is a dry oxide layer.

15. The method of claim 4, further comprising a step of depositing a gate electrode layer on top of the oxidized nitrided gate oxide layer.

16. A method of nitriding a gate oxide layer on a semiconductor substrate comprising:

nitriding the gate oxide layer in the presence of nitric oxide (NO) gas;

wherein the nitriding step is conducted at a temperature of about 800° C. or less and at a pressure of about 1 atm or less in a chemical vapor deposition furnace, wherein the oxide layer on the substrate is thermally grown through thermal oxide formation in a chemical vapor deposition furnace.

17. The method of claim 16, further comprising a step of oxidizing the nitrided gate oxide layer on the substrate.

18. The method of claim 17, further comprising a step of depositing a gate electrode layer on top of the oxidized nitrided gate oxide layer on the substrate.

19. The method of claim 16, further comprising a step of depositing a gate electrode layer on top of the nitrided gate oxide layer on the substrate.

20. The method of claim 19, further comprising a step of doping the gate electrode layer with a dopant.

* * * * *